United States Patent [19]
Salle

[11] Patent Number: 6,091,308
[45] Date of Patent: Jul. 18, 2000

[54] RAPID RESPONSE OSCILLATOR WITH CURRENT-CONTROLLED FREQUENCY

[75] Inventor: Didier Salle, Grenoble, France

[73] Assignee: STMicroelectronics S.A., Gentilly, France

[21] Appl. No.: 09/266,272

[22] Filed: Mar. 11, 1999

[30] Foreign Application Priority Data

Apr. 6, 1998 [FR] France .................................. 98 04241

[51] Int. Cl.[7] .............................................. H03K 3/0231
[52] U.S. Cl. ........................................... 331/111; 331/143
[58] Field of Search ................................ 331/111, 113 R, 331/143, 144

[56] References Cited

U.S. PATENT DOCUMENTS 4,161,703  7/1979  Nutz ......................................... 331/111
5,394,020  2/1995  Nienaber .................................. 327/140

OTHER PUBLICATIONS

IBM Technical Disclosure Bulletin, "Improved Clamp for Differential VCO and Single–Shot", vol. 10 (Jan. 1988), No. 8, pp. 237–238, Armonk, NY USA.

IEEE Journal of Solid–State Circuits, Sneep Et Al., "A New Low–Noise 100–MHZ Balanced Relaxation Oscillator", vol. 25 (Jun. 1990), No. 3, pp. 692–698, NY USA.

*Primary Examiner*—Siegfried H. Grimm
*Attorney, Agent, or Firm*—Theodore E. Galanthay; Allen, Dyer, Doppelt, Milbrath & Gilchrist, P.A.

[57] ABSTRACT

A current-controlled oscillator includes a capacitor, and at least one current source for providing at least one charge current for charging the capacitor. A discharge circuit sequentially discharges the capacitor with a discharge current. A control circuit maintains a mean charge voltage of the capacitor at a preset value by controlling the discharge current. The control circuit includes a current control source forming a current mirror with the at least one current source. The current control source is connected to the discharge circuit for setting the discharge current substantially equal to a sum of the charge currents. The oscillator further includes a correction circuit for correcting the discharge current corresponding to a mean charge of the capacitor.

23 Claims, 2 Drawing Sheets

RAPID RESPONSE OSCILLATOR WITH CURRENT-CONTROLLED FREQUENCY

FIELD OF THE INVENTION

The present invention relates to the field of electronics and, more particularly, to an oscillator.

BACKGROUND OF THE INVENTION

The response time of an oscillator is the time required by the oscillator to change oscillation frequency in response to a frequency modification command. This type of oscillator has applications in demodulators used for frequency-modulated signals, and particularly in the manufacture of SECAM chrominance signal demodulators. More generally, the oscillator has applications in a range of electronic circuits for providing a reference frequency.

FIG. 1 is a schematic representation of the operating principle of a current-controlled frequency oscillator. The oscillator includes a first current source 10 providing a current $I_1$, and a second current source 20 providing a current $I_2$. In the example described, currents $I_1$ and $I_2$ are considered to be equal, i.e., $I=I_1=I_2$. A first capacitor 12 is connected between a first node 14 and a ground terminal 30. The first current source 10 is also connected to the first node 14. A second capacitor 22 is connected between a second node 24 and the ground terminal 30. The second current source 20 is also connected to the second node 24. The two capacitors 12, 22 have the same capacitance rating C.

A switch 32 is used to connect either the first node 14 or the second node 24 to a third current source 34 carrying a current $I_3$. Current $I_3$ is equal to the sum of currents $I_1$ and $I_2$, such that $I_3=I_1+I_2=2I$ in the present example. A memory 36 and two comparators 16, 26 are provided to drive the switch 32 so that first and second nodes 14, 24 are alternately connected to the third current source 34.

The first comparator 16 is connected between the first node 14 and the second node 24 to measure a voltage $V_1=V_{14}-V_{24}$, where $V_{14}$ and $V_{24}$ are the respective potentials of the first and second nodes 14, 24. The second comparator 26 is connected between the second node 24 and the first node 14 such that it measures a voltage $V_2=V_{24}-V_{14}$ of the opposite polarity. The first and second comparators 16, 26 provide a pulse each time $V_1$ or $V_2$ reaches a threshold value $V_{hyst}$ that is the same for the two comparators 16, 26 in the example described. These pulses are transmitted to the memory 36 whose status changes with each pulse. The switch 32 is connected to the memory 36 and is controlled to change the switch status with each pulse.

When the oscillator is in operation, the first and second capacitors 12, 22 are alternately charged and discharged. In a first alternation, as shown in the figure, the first capacitor 14 is charged with current $I_1$, i.e., I supplied by the first current source 10. The switch 32 connects the third current source 34 to the second node 24. The second capacitor 22 is Discharged with a current I, such that $I+I_2=I_3=2I$.

When the voltage $V_1$ of the first capacitor 12 reaches value $V_{hyst}$, the first comparator 16 provides a pulse that changes the status of the memory 36 and the switching status of the switch 32. The switch 32 is then switched to connect the third current source 34 to the first node 14. A second alternation then begins in which first capacitor 14 is discharged and the second capacitor 24 is charged. This second alternation is completed when the second capacitor 26 produces a pulse, i.e., when the voltage $V_2$ of the second capacitor reaches value $V_{hyst}$.

The status of memory 36, which may be considered a type of oscillator, is thus periodically modified. The frequency F of the oscillator is such that:

$$F = \frac{I}{2CV_{hyst}}$$

The frequency of the oscillator may be adjusted by modifying the value of current I, i.e., the intensity of the current sources. The oscillator is thus controlled by the current. The oscillation frequency can also be adjusted by modifying the value of the threshold voltage $V_{hyst}$ of the comparators. The oscillator is then controlled by the voltage.

As described above, the capacitors 12, 22 are respectively charged by equal currents $I_1$, $I_2$ and discharged by current $I_3$. The oscillator will correctly operates provided a mean discharge current $I_3$ is equal to the sum of the charge currents, i.e., $I_3=I_1+I_2$. When this condition is met, the mean charge voltage of the two capacitors 12, 22 is consistent. In effect, the charge voltage of one capacitor increases when that of the other decreases. In contrast, if $I_3 \neq I_1+I_2$, the mean voltage of the capacitors increases or decreases and it quickly becomes impossible to use the oscillator. If $I_3=I_1+I_2$ is never accurately checked, particularly due to the variations in the characteristics of the components, a circuit that checks and adjusts the mean voltage of the capacitors is provided. This type of control circuit is shown in FIG. 2.

FIG. 2 reproduces the components of FIG. 1 required to understand the control circuit. To provide better clarity, the comparators 16, 26 and means for driving the switch 32 are not shown. Since identical components in FIGS. 1 and 2 have the same numbers, the foregoing description applies to these components.

A terminal 40 for measuring the common mode voltage of capacitors 12, 22 is connected to the first and second nodes 14, 24 via respective resistors 42, 44. The common mode voltage $V_{DC}$ provides a measurement of a mean charge voltage of the capacitors 12, 22. Voltage $V_{DC}$ is applied to the base of a first transistor 46 connected in a voltage follower mode. The collector is connected to a power supply voltage, and the emitter is connected to a first branch of a current mirror 50.

The first branch of the current mirror is formed using a second transistor 52 having a base connected to the base of a third transistor 54. The third transistor 54 forms the second branch of the current mirror, which is connected to the switch 32 to receives current $I_3$. The third transistor 54 in FIG. 2 operates as the third current source 34 shown in FIG. 1. Reference 56 is a DC power supply connected in series between the first and second transistors 46, 52. This power supply maintains the voltage $V_{DC}$ at the precise value required for correct operation of the current sources 10 and 20.

The first transistor 46 and the current mirror 50 control the discharge current $I_3$, which maintains the mean charge voltage of the capacitors at a preset value $V_{DC}$. When voltage $V_{DC}$ increases, the base voltages of first transistor 46 increases and the base voltages of the second transistor 52 also increases. The second transistor 52 has a collector and a base connected to the emitter of the first transistor 46 via the DC voltage source 56. The second transistor 52 therefore carries a higher current.

Since the third and second transistors form the current mirror 50, an increase in current in the first branch of the mirror, which includes the second transistor 52, causes an increase in current in the second branch of the mirror, i.e., an increase in capacitor discharge current $I_3$. This increase in the discharge current of the capacitors tends to reduce the charge voltage at their terminals and thereby reduce voltage $V_{DC}$.

Conversely, reducing the mean charge voltage of the capacitors causes a reduction in the current passing through the current mirror 50 and a reduction in the discharge current $I_3$. The reduction in discharge current $I_3$ causes an increase in the mean charge voltage. The discharge current control circuit thus forms a counter-reaction loop that stabilizes the voltage $V_{DC}$ at a balanced value. For the oscillator shown in FIG. 2 to be used in a demodulator, such as a SECAM chrominance signal demodulator, the oscillation frequency must be capable of being adjusted very rapidly to match the modulated frequency of the sub-carriers. This frequency is adjusted by instantaneous modifications to the current intensities $I_1$ and $I_2$ of the respective first and second current sources 10, 20.

However, the discharge current control circuit reacts slowly and the voltage of the common mode voltage $V_{DC}$ varies significantly before the discharge current compensates for variations in the charge currents. The oscillator is therefore unsuitable for frequency changes that are too large or too rapid. For example, a 10% variation in a frequency of 4.4 MHz in less than 1 microsecond is not possible.

SUMMARY OF THE INVENTION

An object of the present invention is to provide a current-controlled frequency oscillator, the frequency of which may be changed rapidly and significantly.

Another object of the invention to provide a current-controlled frequency oscillator with capacitors, wherein the changes in frequency have no significant influence on the mean charge voltage of the capacitors.

Yet another objective of the present invention is to provide a current-controlled frequency oscillator comprising capacitors whose mean charge voltage may also be corrected as a result of any disparity in component characteristics.

To achieve these objects and others, the invention relates more precisely to an oscillator whose frequency is determined by current. The oscillator comprises at least one capacitor, at least one current source for charging the at least one capacitor, a discharge circuit for sequentially discharging the capacitor with a discharge current, and a control circuit for controlling the discharge current for maintaining a mean charge voltage of the capacitor at a preset value.

According to the invention, the control circuit includes at least one current source, described as the control source, for forming a current mirror with at: least one charge current source, and is connected to a discharge circuit for setting a discharge current equal to the sum of the charge currents of each charge current source. Since the control current source forms a current mirror with one or more charge current sources, the discharge current is instantaneously modified with the charge current sources. Correction of the discharge current is therefore no longer dependent upon a prior drift of the common mode voltage. The mean charge voltage of the capacitor or capacitors remains virtually unaffected by changes in the charge current, i.e., it remains unaffected by changes in oscillator frequency.

In one implementation of the oscillator, the oscillator may comprise first and second charge current sources, the control current source forms, together with the current sources, a current mirror to impose on the discharge circuit a discharge current equal to the sum of the charge currents of the first and second current sources. In a symmetrical embodiment, the two charge current sources may be provided to deliver charge currents of the same intensity.

The oscillator of the invention may be formed using one or more capacitors. In a single-capacitor embodiment, the oscillator may comprise a single capacitor having a first plate connected to the first current source, and a second plate connected to the second current source. The first and second plates of the capacitor are also connected to the terminals of a switch forming part of the discharge circuit of the capacitor.

In a modification of the invention, the oscillator may also comprise two or more capacitors, each having a first and second plate. The first plates are connected to the first and second current sources, and the second plates are connected in common to a reference potential. The first plates of the capacitor are thus also connected to the terminals of a switch forming part of the sequential discharge circuit for alternately discharging the two capacitors.

The apparatus of the invention may also comprises a correction circuit for correcting the discharge current corresponding to a mean charge of the capacitor or capacitors. The correction circuit is used to correct and compensate for slight variations in the charge voltage of the capacitors due to variations of the characteristics of the oscillator components. In particular, intensity offset errors of the current mirror or mirrors may be compensated.

In one embodiment of the correction circuit, the circuit may comprise a transconductance amplifier having a first input connected to a reference potential, and a second input connected to a mean charge voltage measuring terminal. At least one output is connected to the discharge circuit for increasing the discharge current when the mean charge voltage of the capacitors increases, and for reducing the discharge current when the mean charge voltage of the capacitors decreases.

The transconductance amplifier may, for example, be a differential amplifier with a first output connected to a first branch of a current mirror connected to the control current source. The differential amplifier includes a second output connected to a second branch of the current mirror connected to a discharge terminal of the capacitor or capacitors. The discharge terminal may, for example, consist of the switch of the sequential discharge circuit. Other characteristics and advantages of the present invention will be better understood from the following detailed description which refers to the attached figures. The description is illustrative and of a non-limitative example.

DETAILED DESCRIPTION OF THE PREFERRED EMBODIMENTS

Figure 1:
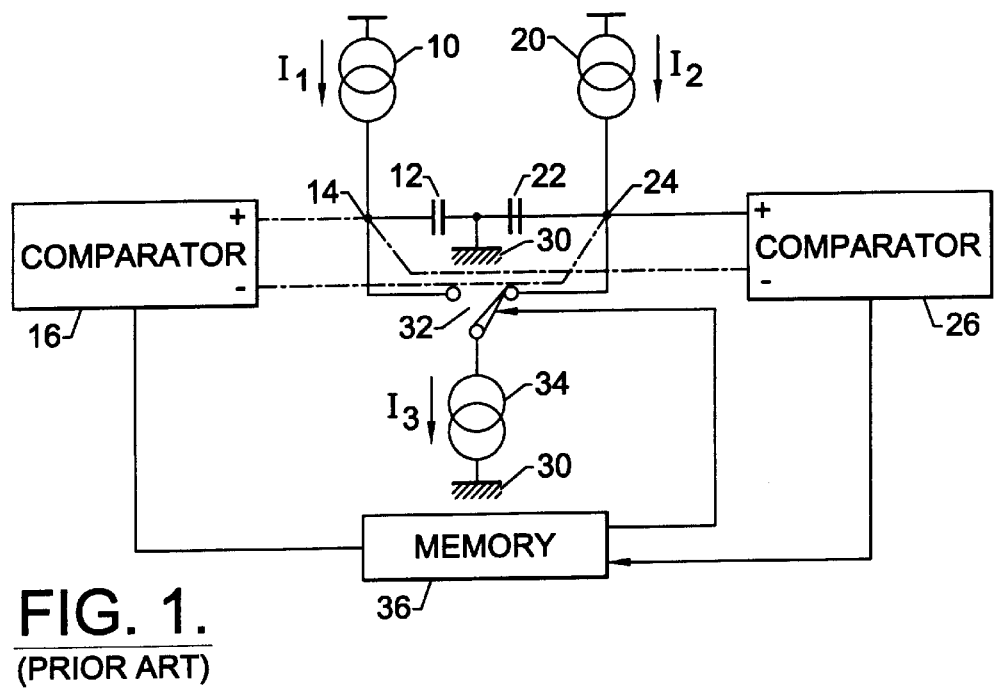
FIG. 1 is a schematic diagram of an oscillator in which the frequency is controlled by the current according to the prior art.
Figure 2:
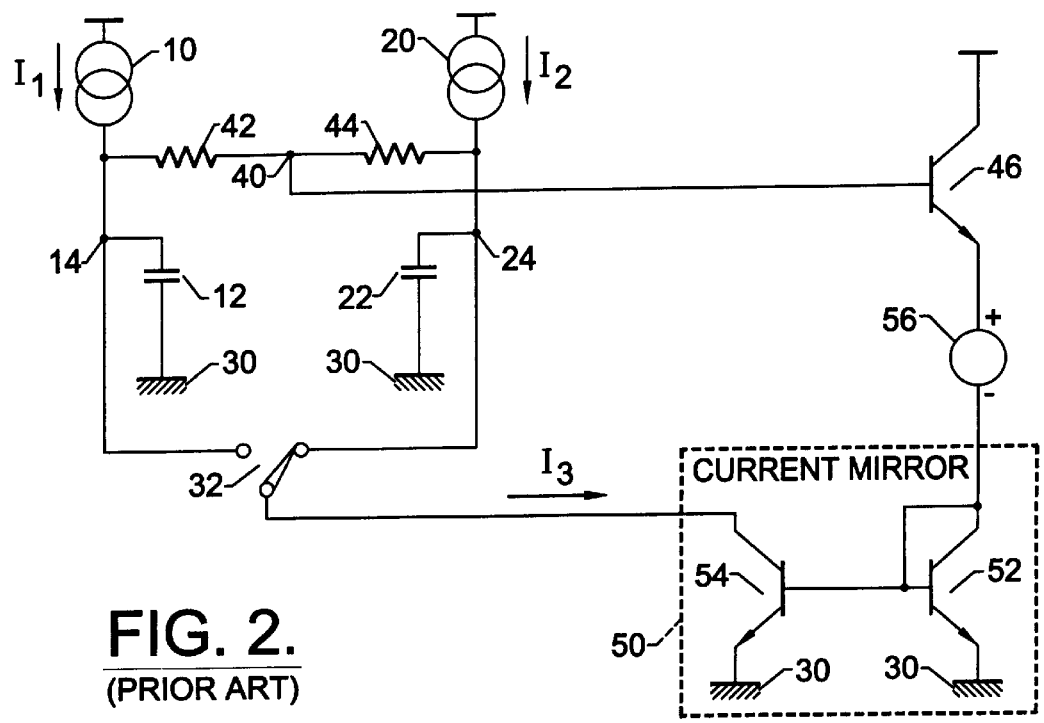
FIG. 2 is a simplified electronic diagram of the oscillator of FIG. 1, including a circuit for controlling the operating voltage of the oscillator.
Figure 3:
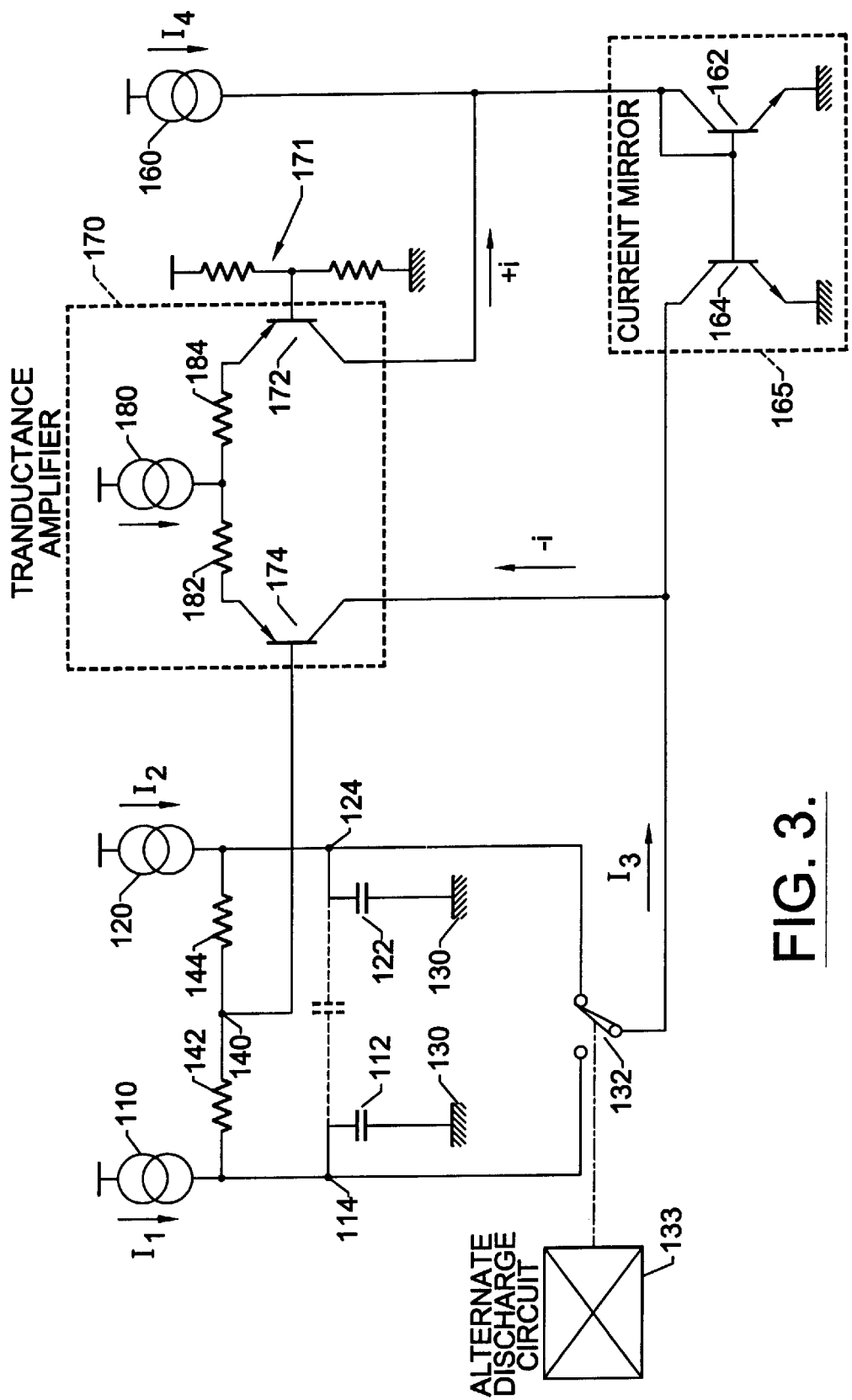
FIG. 3 is a simplified electronic diagram of an embodiment of an oscillator according to the invention.

A certain number of components or sections of the oscillator of FIG. 3 are identical, similar or equivalent to those of FIGS. 1 and 2 as described above. These items are numbered as in FIGS. 1 and 2, except a 100 has been added to the reference number.

The oscillator comprises first and second current sources 110, 120 respectively connected to the first plates of the first and second capacitors 112, 122 at nodes 114, 124. The second plates of the capacitors 112, 122 are connected to a reference potential 130. The reference potential is ground, for example. A switch 132 alternately connects one of the nodes 114, 124 to a discharge circuit that will be described below.

An alternate discharge circuit 133 of the capacitors and the circuits for driving the switch 132 are of types known in the art, and are not shown in detail in FIG. 3. These circuits may, for example, be provided by using one or more comparators to compare the charge voltage of the capacitors with a set value. On this subject, reference may be made to the descriptions of FIG. 1.

According to one modification of the invention, the oscillator may be constructed using a single capacitor connected between the nodes 114 and 124. This type of capacitor is shown in FIG. 3 using dotted lines. The first and second current sources 110 and 120 provide currents $I_1$ and $I_2$ respectively. To simplify the present description, it will be assumed that the capacitors 112, 122 have the same capacitance rating, and that currents $I_1$ and $I_2$ are equal, i.e., $I_1=I_2=I$.

The oscillator is provided with a discharge current control circuit that essentially comprises a current source 160 used to control the discharge current $I_3$ of the capacitors. The current source 160 is connected to the switch 132. This connection may be made either directly or, as in the example shown in FIG. 3, via transistors 162, 164. The transistors 162, 164 form a current mirror 165.

Current source 160, referred to below as the control source, forms a current mirror with first and second current sources 110, 120 to provide a current $I_4$ equal to the sum $I_4=I_1+I_2$ of the currents provided by the first and second current sources. In one embodiment, the first and second current sources 110, 120 and the control current source 160 may consist of transistors with three branches of a single source forming a current mirror for providing currents such that $I_1=I_2=I$ and $I_4=2I$.

The current mirror formed by the transistors 162, 164 connected between the control source 160 and the switch 132 duplicate the current $I_4$ such that the discharge current $I_3$ is equal to current $I_4$, wherein $I_3=I_4=2I=I_1+I_2$. The discharge current I3 accurately compensates the charge currents $I_1+I_2$, and the mean charge voltage of the capacitors is maintained constant independently of variations in $I_1$ and $I_2$, and independently of the frequency.

In an improvement, the oscillator of FIG. 3 also comprises a circuit for correcting the discharge current according to the mean charge voltage of the capacitors. This voltage, noted as $V_{DC}$, is measured on a terminal 140 connected to nodes 114 and 124 by respective resistors 142 and 144. In the symmetrical example described, resistors 142 and 144 have the same rating.

A first input of a transconductance amplifier 170 is connected to a reference voltage forming a resistance bridge 171 between the power supply potential and ground. Voltage $V_{DC}$ is supplied to a second input of the transconductance amplifier. The inputs of the transconductance amplifier are respectively formed by the bases of the first and second transistors 172, 174. The emitters of the transistors 172, 174 are respectively connected to a polarization current source 180 via resistors 182 and 184.

The collectors of the first and second transistors 172, 174 of the amplifier are respectively connected to the collectors of the first and second transistors 162, 164 of the current mirror 165. When the voltage $V_{DC}$ varies, the transconductance amplifier 170 emits a current +i via the collector of the first transistor 172. The current +i is added to the current $I_4$ supplied by the control current source 160.

Transconductance amplifier 170 also emits a current −i via the collector of the second transistor 174 that is deducted from the current of the second branch of current mirror 165. The discharge current $I_3$ thus becomes equal to $I_3=I_4+i-(-i)=I_4+2i$. The polarity of the current i depends on whether $V_{DC}$ increases or decreases. An increase in $V_{DC}$ produces a positive current i, and a decrease in $V_{DC}$ produces a negative current i. The differential current 2i produced by the transconductance amplifier 170 compensates for slow drifts of the mean charge voltage due, for example, to variations in the characteristics of the components providing a current $I_3$ slightly different from $I_1+I_2$.

What is claimed is:

1. An oscillator comprising:

at least one capacitor;

at least one current source for providing at least one charge current for charging said at least one capacitor;

a discharge circuit for sequentially discharging said at least one capacitor with a discharge current; and a control circuit for maintaining a mean charge voltage of said at least one capacitor at a preset value by controlling the discharge current;

said control circuit comprising at least one current control source forming a current mirror with said at least one current source, said at least one current control source being connected to said discharge circuit for setting the discharge current substantially equal to a sum of the at least one charge current.

2. An oscillator according to claim 1, wherein said at least one charge current source comprises first and second charge current sources for providing a respective first and second charge current; and wherein said at least one current control source defines with said first and second charge current sources a current mirror for causing said discharge circuit to set the discharge current substantially equal to a sum of the first and second charge currents.

3. An oscillator according to claim 2, wherein the first and second charge currents are substantially equal in value.

4. An oscillator according to claim 2, wherein said discharge circuit comprises a switch; and wherein said at least one capacitor has a first plate connected to said first charge current source, and a second plate connected to said second charge current source, the first and second plates being connected to respective terminals of said switch.

5. An oscillator according to claim 2, wherein said discharge circuit comprises a switch; and wherein said at least one capacitor comprises at least two capacitors, each capacitor having a first plate connected to a respective said first and second charge current source and a second plate connected in common to a reference potential, the first plates being connected to terminals of said switch.

6. An oscillator according to claim 1, further comprising a correction circuit for correcting the discharge current corresponding to the mean charge of said at least one capacitor.

7. An oscillator according to claim 6, wherein said correction circuit comprises a transconductance amplifier having a first input connected to a reference potential, a second input connected to a mean charge voltage measuring terminal for said at least one capacitor, and at least one output connected to said discharge circuit, wherein said discharge circuit increases the discharge current when the mean charge voltage of said at least one capacitor increases, and said discharge circuit decreases the discharge current when the mean charge voltage of said at least one capacitor decreases.

8. An oscillator according to claim 7, wherein said transconductance amplifier comprises a differential amplifier having a first output being connected to a first branch of said current mirror connected to said current control source, and a second output being connected to a second branch of said current mirror being connected to a discharge terminal of said at least one capacitor.

9. An oscillator comprising:
at least one capacitor;
at least one current source for providing at least one charge current for charging said at least one capacitor;
a discharge circuit for sequentially discharging said at least one capacitor with a discharge current substantially equal to a sum of the at least one charge current;
a control circuit for maintaining a mean charge voltage of said at least one capacitor at a preset value by controlling the discharge current; and
a correction circuit for correcting the discharge current corresponding to the mean charge of said at least one capacitor.

10. An oscillator according to claim 9, wherein said control circuit comprises at least one control current source forming a current mirror with said at least one current source, said at least one current control source being connected to said discharge circuit for setting the discharge current substantially equal to a sum of the at least one charge current.

11. An oscillator according to claim 9, wherein said correction circuit comprises a transconductance amplifier having a first input connected to a reference potential, a second input connected to a mean charge voltage measuring terminal for said at least one capacitor, and at least one output connected to said discharge circuit, wherein said discharge circuit increases the discharge current when the mean charge voltage of said at least one capacitor increases, and said discharge circuit decreases the discharge current when the mean charge voltage of said at least one capacitor decreases.

12. An oscillator according to claim 11, wherein said transconductance amplifier comprises a differential amplifier having a first output being connected to a first branch of said current mirror connected to said current control source, and a second output being connected to a second branch of said current mirror being connected to a discharge terminal of said at least one capacitor.

13. An oscillator according to claim 9, wherein said at least one charge current source comprises first and second charge current sources for providing a respective first and second charge current; and wherein said at least one current control source defines with said first and second charge current sources a current mirror for causing said discharge circuit to set the discharge current substantially equal to a sum of the first and second charge currents.

14. An oscillator according to claim 13, wherein the first and second charge currents are substantially equal in value.

15. An oscillator according to claim 13, wherein said discharge circuit comprises a switch; and wherein said at least one capacitor has a first plate connected to said first charge current source, and a second plate connected to said second charge current source, the first and second plates being connected to respective terminals of said switch.

16. An oscillator according to claim 13, wherein said discharge circuit comprises a switch; and wherein said at least one capacitor comprises at least two capacitors, each capacitor having a first plate connected to a respective said first and second charge current source and a second plate connected in common to a reference potential, the first plates being connected to terminals of said switch.

17. A method for providing a current-controlled frequency oscillator, the method comprising the steps of:
providing at least one charge current for charging at least one capacitor;
sequentially discharging the at least one capacitor with a discharge current;
maintaining a mean charge voltage of the at least one capacitor at a preset value by controlling the discharge current; and
correcting the discharge current corresponding to a mean charge of the at least one capacitor.

18. A method according to claim 17, wherein the step of maintaining a mean charge voltage comprises forming a current mirror with at least one current control source and at least one current source, and connecting the at least one current control source to a discharge circuit for setting the discharge current substantially equal to a sum of the at least one charge current.

19. A method according to claim 17, wherein the step of correcting comprises connecting a first input of a transconductance amplifier to a reference potential, and connecting a second input of the transconductance amplifier to a mean charge voltage measuring terminal for the at least one capacitor, and connecting at least one output of the transconductance amplifier to a discharge circuit, wherein the discharge circuit increases the discharge current when the mean charge voltage of the at least one capacitor increases, and the discharge circuit decreases the discharge current when the mean charge voltage of the at least one capacitor decreases.

20. A method according to claim 17, wherein the step of providing at least one charge current comprises providing first and second charge current sources for providing a respective first and second charge current; and wherein the at least one current control source defines with the first and second charge current sources a current mirror for causing a discharge circuit to set the discharge current substantially equal to a sum of the first and second charge currents.

21. A method according to claim 20, wherein the first and second charge currents are substantially equal in value.

22. A method according to claim 20, wherein the discharge circuit comprises a switch; and wherein the at least one capacitor has a first plate connected to the first charge current source, and a second plate connected to the second charge current source, the first and second plates being connected to respective terminals of the switch.

23. A method according to claim 20, wherein the discharge circuit comprises a switch; and wherein the at least one capacitor comprises at least two capacitors, each capacitor having a first plate connected to a respective first and second charge current source and a second plate connected in common to a reference potential, the first plates being connected to terminals of the switch.

* * * * *